US012604548B2

(12) United States Patent
Cheng et al.

(10) Patent No.: US 12,604,548 B2
(45) Date of Patent: Apr. 14, 2026

(54) REDUCED-HEIGHT IMAGE-CAPTURING MODULE

(71) Applicant: BISON ELECTRONICS INC., Taipei City (TW)

(72) Inventors: Shun-Chou Cheng, New Taipei City (TW); Li-Ying Chen, New Taipei City (TW)

(73) Assignee: BISON ELECTRONICS INC., Taipei City (TW)

( * ) Notice: Subject to any disclaimer, the term of this patent is extended or adjusted under 35 U.S.C. 154(b) by 354 days.

(21) Appl. No.: 18/212,230

(22) Filed: Jun. 21, 2023

(65) Prior Publication Data

US 2024/0304640 A1 Sep. 12, 2024

(30) Foreign Application Priority Data

Mar. 8, 2023 (TW) ................................. 112108400

(51) Int. Cl.
| | |
|---|---|
| *H10F 39/00* | (2025.01) |
| *G02B 7/00* | (2021.01) |
| *H10W 72/59* | (2026.01) |
| *H10W 72/90* | (2026.01) |
| *H10W 90/00* | (2026.01) |

(52) U.S. Cl.
CPC ........... *H10F 39/804* (2025.01); *G02B 7/006* (2013.01); *H10F 39/806* (2025.01); *H10F 39/811* (2025.01); *H10W 72/90* (2026.01); *H10W 72/59* (2026.01); *H10W 90/754* (2026.01)

(58) Field of Classification Search
CPC .... H10F 39/804; H10F 39/806; H10F 39/811; G02B 7/006; H01L 24/05; H01L 24/48; H01L 2224/04042; H01L 2224/48227; H10W 72/90; H10W 72/59; H10W 90/754; H10W 72/50
See application file for complete search history.

(56) References Cited

U.S. PATENT DOCUMENTS

2021/0028216 A1* 1/2021 Hubert ................... H04N 23/55

* cited by examiner

*Primary Examiner* — Jonathan Han
(74) *Attorney, Agent, or Firm* — Li & Cai Intellectual Property (USA) Office

(57) ABSTRACT

The present invention provides a reduced-height image-capturing module, which includes a lens assembly, an image-sensing chip, a carrier base and a circuit substrate. The carrier base has a base body, two extending plate bodies extending and a base groove recessed. A lower portion of the base body enters a through opening of the circuit substrate, and the two extending plate bodies cross over the through opening of the circuit substrate and are disposed on an upper surface of the circuit substrate. The image-sensing chip is disposed on a recessed bottom surface of the base groove which is not at the same level as the upper surface of the circuit substrate, so that the recessed bottom surface is lower than the upper surface of the circuit substrate. The lens assembly is disposed on the upper portion of the base body and corresponds to the image-sensing chip.

8 Claims, 5 Drawing Sheets

REDUCED-HEIGHT IMAGE-CAPTURING MODULE

CROSS-REFERENCE TO RELATED PATENT APPLICATION

This application claims the benefit of priority to Taiwan Patent Application No. 112108400, filed on Mar. 8, 2023. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an image-capturing module, and more particularly to a reduced-height image-capturing module.

BACKGROUND OF THE DISCLOSURE

With the development and advancement of technology, portable electronic products such as mobile phones, tablets or notebooks have become indispensable and convenient tools for the public in daily life or work, especially the above-mentioned portable electronic products are usually equipped with an image-capturing module to facilitate users to capture images. Since the development trend of the portable electronic product is towards lightness, thinness, shortness and smallness, the image-capturing module provided by the portable electronic product also needs to be correspondingly thinned to meet the current demand for thinner products.

In the prior art, the image-capturing module is mainly composed of a circuit substrate, an image-sensing chip, a lens assembly and other electronic components. The optical length TTL (Total Track Length) of the lens structure in the lens assembly has the greatest influence on the height of the image-capturing module, and the TTL is the distance from the surface of the lens structure to the photosensitive surface of the image-sensing chip for clear imaging. Therefore, how to reduce the height of the image-capturing module without changing the TTL should be solved.

By a COB (Chip-On-Board) process, the image-sensing chip is placed on the upper surface of the circuit substrate, and the lens assembly is arranged on the upper surface of the circuit substrate, but the stacking height of the circuit substrate and the image-sensing chip plus TTL is very unfavorable to the height of the image-capturing module. Although the height of the image-capturing module can be effectively reduced by using a higher-level Flip-Chip process to place the image-sensing chip on the lower surface of the circuit substrate with openings, and arrange the lens assembly on the upper surface of the circuit substrate, the cost of construction and maintenance is too high, and if it does not reach a certain scale of production, there will be no economic benefits.

SUMMARY OF THE DISCLOSURE

In response to the above-referenced technical inadequacy, the present disclosure provides a reduced-height image-capturing module.

In order to solve the above-mentioned problems, one of the technical aspects adopted by the present disclosure is to provide a reduced-height image-capturing module, which includes a lens assembly, an image-sensing chip, a carrier base and a circuit substrate. The circuit substrate has a through opening. The carrier base has a base body, two extending plate bodies extending laterally outward from an upper portion of the base body, and a base groove recessed downward from the upper portion of the base body. A lower portion of the base body is configured to enter the through opening of the circuit substrate, and the two extending plate bodies cross over the through opening of the circuit substrate and are disposed on an upper surface of the circuit substrate. The image-sensing chip is disposed on a recessed bottom surface of the base groove, and the recessed bottom surface of the base groove and the upper surface of the circuit substrate are not at a same level, so that the recessed bottom surface of the base groove is lower than the upper surface of the circuit substrate. The lens assembly is disposed on the upper portion of the base body and corresponds to the image-sensing chip.

In one of the possible or preferred embodiments, the lens assembly includes a lens holder disposed on the upper portion of the base body and a lens structure carried by the lens holder, and the lens structure corresponds to a photosensitive surface of the image-sensing chip.

In one of the possible or preferred embodiments, the reduced-height image-capturing module further includes a filter disposed between the image-sensing chip and the lens structure.

In one of the possible or preferred embodiments, the base groove of the carrier base is a stepped groove, and the base groove includes a first groove and a second groove formed under the first groove and communicated with the first groove; wherein a projection area of the first groove is greater than a projection area of the second groove, and a projection area of the filter is greater than the projection area of the second groove and less than the projection area of the first groove, so that the filter is accommodated in the first groove of the base groove, and the image-sensing chip is accommodated in the second groove of the base groove.

In one of the possible or preferred embodiments, the image-sensing chip includes a plurality of chip metal pads disposed around a photosensitive surface thereof, and the carrier base includes a plurality of recessed metal pads disposed on the recessed bottom surface of the base groove, and the chip metal pads are electrically connected to the recessed metal pads by a plurality of metal leads, respectively.

In one of the possible or preferred embodiments, the carrier base includes a plurality of lower metal pads disposed on a lower surface of each extending plate body thereof, and the circuit substrate includes a plurality of upper metal pads disposed on the upper surface thereof and around the through opening, and the lower metal pads are electrically connected to the upper metal pads through a plurality of conductive materials, respectively.

In one of the possible or preferred embodiments, the recessed metal pads are electrically connected to the lower metal pads through a plurality of conductive lines of the carrier base, respectively.

In one of the possible or preferred embodiments, the recessed bottom surface of the base groove is lower than a lower surface of the circuit substrate.

Therefore, in the height-reduced image-capturing module provided by the present disclosure, by virtue of "the circuit substrate having a through opening," "the carrier base having a base body, two extending plate bodies extending laterally outward from an upper portion of the base body, and a base groove recessed downward from the upper portion of the base body," "a lower portion of the base body being configured to enter the through opening of the circuit substrate," "the two extending plate bodies crossing over the through opening of the circuit substrate and are disposed on an upper surface of the circuit substrate," "the image-sensing chip being disposed on a recessed bottom surface of the base groove, and the recessed bottom surface of the base groove and the upper surface of the circuit substrate being not at a same level, so that the recessed bottom surface of the base groove is lower than the upper surface of the circuit substrate" and "the lens assembly being disposed on the upper portion of the base body and corresponds to the image-sensing chip," the lower portion of the base body enters the through opening of the circuit substrate from the upper surface of the circuit substrate, so that the recessed bottom surface of the base groove is lower than the upper surface of the circuit substrate. In addition, the image-sensing chip can be arranged on the recessed bottom surface of the base groove by the COB process, and the lens assembly can be arranged on the upper portion of the substrate body and correspond to the image-sensing chip, so that the height of the image-capturing module can be reduced to a similar height of the module using the Flip-Chip process without changing the TTL.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
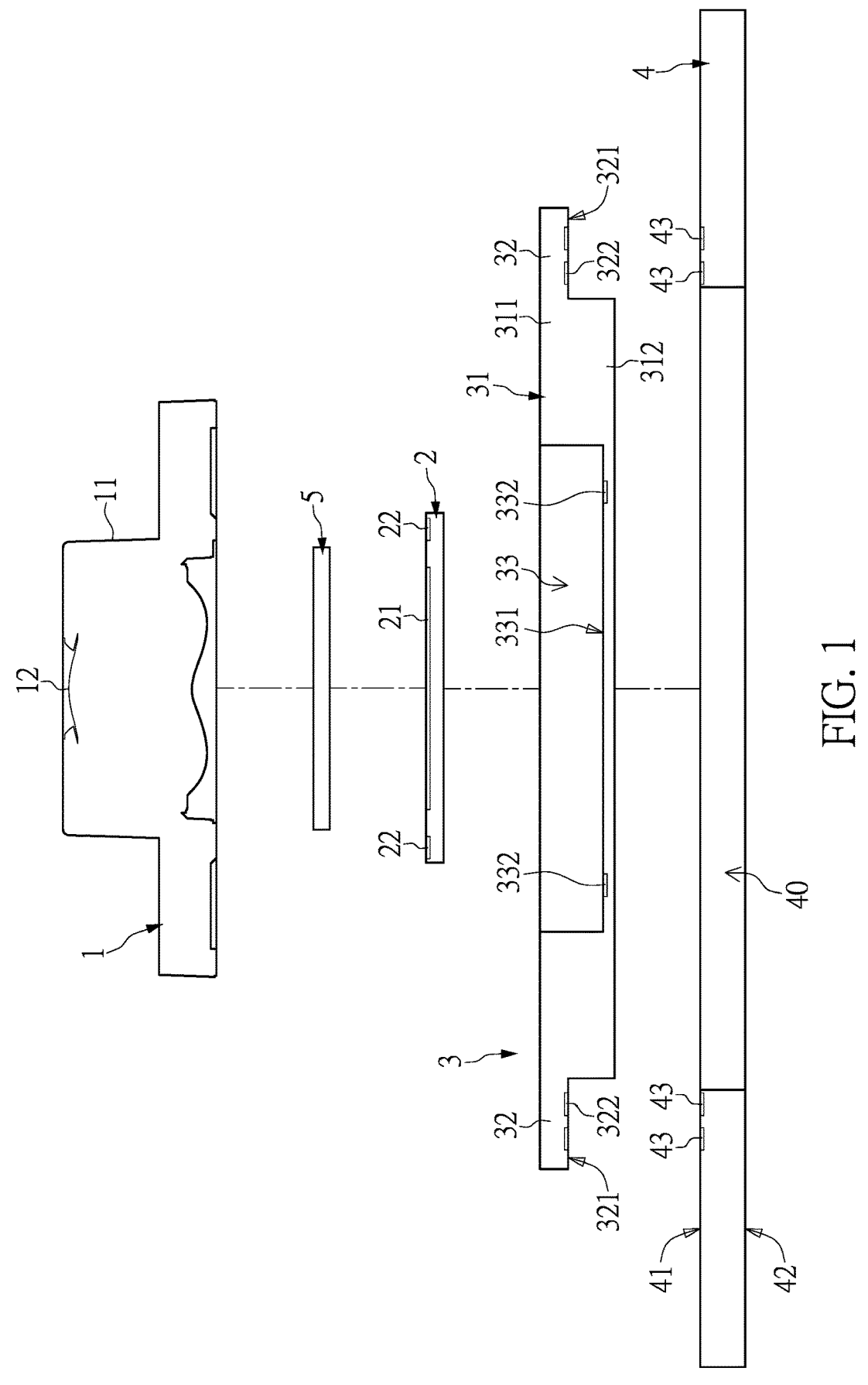
FIG. 1 is a schematic exploded view of an image-capturing module according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

Referring to FIG. 1 to FIG. 5, the present disclosure provides a reduced-height image-capturing module (or a reduced-height image-sensing module). The height-reduced image-capturing module includes a lens assembly 1, an image-sensing chip 2 (or an image sensor chip), a carrier base 3, and a circuit substrate 4. The circuit substrate 4 has a through opening 40. The carrier base 3 has a base body 31, two extending plate bodies 32 extending laterally outward from the upper portion 311 of the base body 31, and a base groove 33 recessed downward from the upper portion 311 of the base body 31. The lower portion 312 of the base body 31 enters the through opening 40 of the circuit substrate 4. The two extending plate bodies 32 cross over the through opening 40 of the circuit substrate 4 and are disposed on the upper surface 41 of the circuit substrate 4. The image-sensing chip 2 is disposed on the recessed bottom surface 331 of the base groove 33, which is not at the same level as the upper surface 41 of the circuit substrate 4 (for example, the recessed bottom surface 331 of the base groove 33 is lower than the upper surface 41 of the circuit substrate 4. The lens assembly 1 is disposed on the upper portion 311 of the base body 31 and corresponds to the image-sensing chip 2. Therefore, the lower portion 312 of the base body 31 enters the through opening 40 of the circuit substrate 4 from the upper surface 41 of the circuit substrate 4, so that the recessed bottom surface 331 of the base groove 33 is lower than the upper surface 41 of the circuit substrate 4. In addition, the image-sensing chip 2 can be arranged on the recessed bottom surface 331 of the base groove 33 by the COB process, and the lens assembly 1 can be arranged on the upper portion 311 of the substrate body 31 and correspond to the image-sensing chip 2, so that the height of the image-capturing module can be reduced to a similar height of the module using the Flip-Chip process without changing the TTL.

First Embodiment

Figure 2:
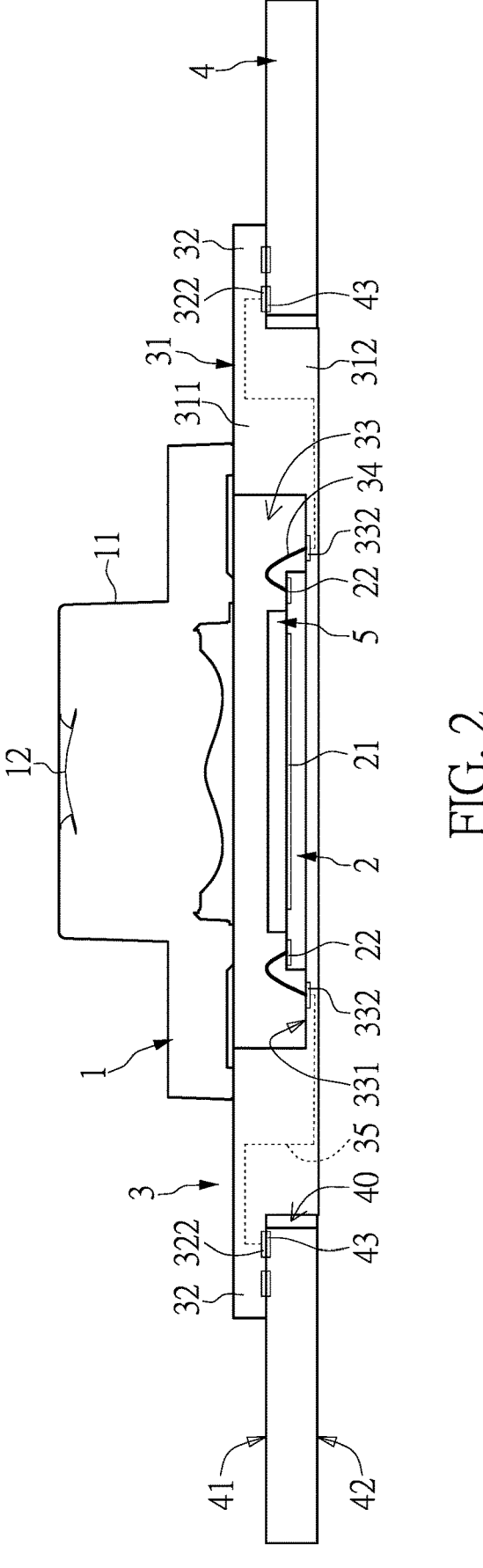
FIG. 2 is a schematic assembled view of the image-capturing module according to the first embodiment of the present disclosure.

Referring to FIG. 1 and FIG. 2, a first embodiment of the present disclosure provides a height-reduced image-capturing module (hereinafter referred to as an image-capturing module), which includes a lens assembly 1, an image-sensing chip 2, a carrier base 3 and a circuit substrate 4.

The circuit substrate 4 has an upper surface 41 (or an upper plate surface) and a lower surface 42 (or a lower plate surface) opposite to each other, and the circuit substrate 4 has a through hole 40 passing through the entire circuit substrate 4 (that is to say, the through hole 40 passes through the upper surface 41 and the lower surface 42 of the circuit substrate 4.

The carrier base 3 has a base body 31 and a base groove 33, and the base groove 33 is recessed in a direction from the upper portion 311 of the base body 31 toward the lower portion 312 of the base body 31, so that the carrier base 3 is formed with the base groove 33 that faces upward. The projection area (or the vertical projection area) of the base body 31 corresponds to the through hole 40 of the circuit substrate 4. It can also be said that the projection area of the lower portion 312 of the base body 31 is slightly smaller than the opening area of the through hole 40 of the circuit substrate 4, so that the lower portion 312 of the base body 31 can move downward and enter the through opening 40 of the circuit substrate 4 from the upper surface 41 of the circuit substrate 4. Moreover, the two extending plate bodies 32 are formed by extending laterally and outward from the upper portion 311 of the base body 31 (that is to say, the two extending plate bodies 32 can be integrally formed by extending leftward and rightward respectively from the upper portion 311 of the base body 31), so that the side edge of the carrier base 3 is formed with steps and is shown as a stepped shape. Moreover, the two extending plate bodies 32 are disposed across the through opening 40 of the circuit substrate 4 and on the upper surface 41 of the circuit substrate 4, so that the lower portion 312 of the base body 31 can be held in the through opening 40 of the circuit substrate 4.

As mentioned above, the lower surface 321 of each extending plate body 32 is formed with a plurality of lower metal pads 322 (or under-plate metal pads), and the upper surface 41 of the circuit substrate 4 is formed with a plurality of upper metal pads 43 (or on-plate metal pads) around the through opening 40, and the lower metal pads 322 can be electrically connected to the upper metal pads 43 through a plurality of conductive materials (such as solder, solder paste or any conductive material, not shown in figures), respectively, so that the carrier base 3 and the circuit substrate 4 are electrically connected with each other.

Moreover, a plurality of recessed metal pads 332 are disposed on the recessed bottom surface 331 of the base groove 33, and a plurality of chip metal pads 22 are disposed around a photosensitive surface 21 (or a sensing surface) of the image-sensing chip 2, and the image-sensing chip 2 can be arranged on the recessed bottom surface 331 of the base groove 33 by using a COB (Chip On Board) process or a wire bonding process, so that the plurality of chip metal pads 22 are electrically connected to the plurality of recessed metal pads 332 respectively. For example, each of the chip metal pads 22 can be electrically connected to the recessed metal pads 332 by a plurality of metal leads 34, respectively. Moreover, the plurality of recessed metal pads 332 can also be respectively and electrically connected to the plurality of lower metal pads 322 through the conductive lines 35 formed inside (or outside) the carrier base 3, but the arrangement of the conductive lines 35 of this embodiment is not limited to what is shown in the drawings.

The lens assembly 1 includes a lens holder 11 disposed on the upper portion 311 of the base body 31 and a lens structure 12 carried by the lens holder 1, and the lens structure 12 may be composed of a single optical lens or a plurality of optical lenses, but the lens assembly 1 of this embodiment is not limited to this example. The image-sensing chip 2 can be a complementary metal-oxide semiconductor (CMOS) chip or a charge-coupled device (CCD) chip, but the image-sensing chip 2 of this embodiment is not limited to this example. The lens structure 12 of the lens assembly 1 corresponds to the photosensitive surface 21 of the image-sensing chip 2, so that light can pass through the lens structure 12 and be received by the photosensitive surface 21 of the image-sensing chip 2.

It should be noted that, as shown in FIG. 2, the recessed bottom surface 331 of the base groove 33 of this embodiment is not at the same level as the upper surface 41 of the circuit substrate 4 (that is to say, the recessed bottom surface 331 of the base groove 33 is lower than the upper surface 41 of the circuit substrate 4). Under the condition that the TTL does not change (that is to say, the distance between the upper surface of the lens structure 12 and the image-sensing chip 2 cannot be changed), the image-sensing chip 2 is placed on the recessed bottom surface 331 of the base groove 33 by the COB process, so as to avoid the stacking height generated by placing the image-sensing chip 2 on the upper surface 41 of the circuit substrate 4 by the COB process. In addition, the circuit substrate 4 does not need to be thinned due to the stacking height generated by the image-sensing chip 2 being placed on the upper surface 41 of the circuit substrate 4, and can even be thickened to strengthen the structural reliability of the image-capturing module. Furthermore, since the image-sensing chip 2 can be pre-installed on the carrier base 3 to form a modular component with the carrier base 3, it can be easily produced and repaired. It is worth mentioning that since the reduced-height image-capturing module of this embodiment can have a similar module height to the image-capturing module using the Flip-Chip process, the process of this embodiment using the COB process to place the image-sensing chip 2 on the recessed bottom surface 331 of the base groove 33 of the carrier base 3 and then insert the carrier base 3 into the through opening 40 of the circuit substrate 4 can be referred to as an SFC (Similar Flip Chip or Smart Flip-Chip) process.

In addition, as shown in FIG. 2, the image-capturing module of this embodiment may further include a filter 5 (or an optical filter). The filter 5 can be disposed above the image-sensing chip 2, and the filter 5 is disposed between the image-sensing chip 2 and the lens structure 12. The filter 5 may be an infrared filter or a visible light filter as required, but it is not limited to this example. In other embodiments, the filter 5 may be provided or omitted as required.

Second Embodiment

Figure 3:
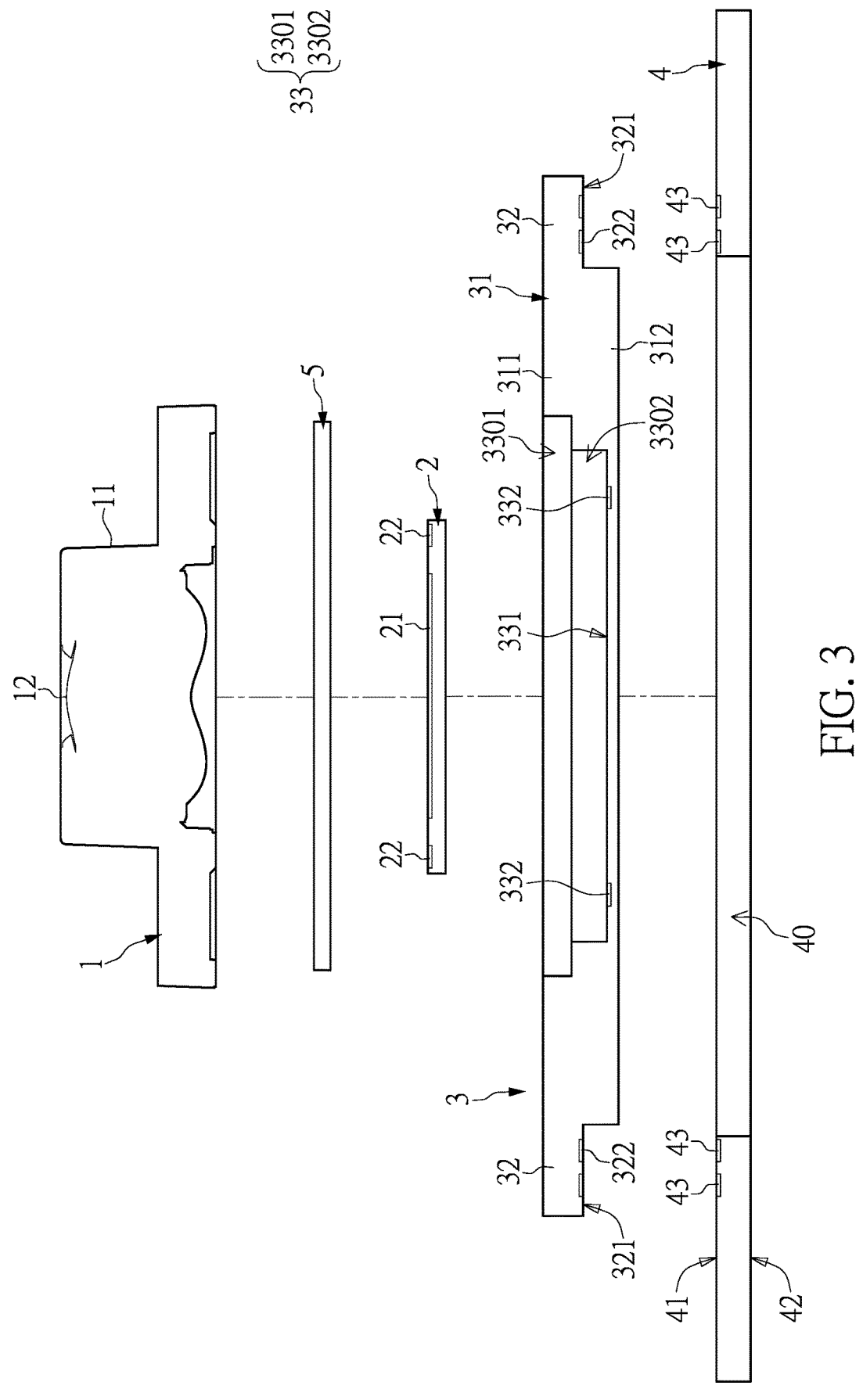
FIG. 3 is a schematic exploded view of the image-capturing module according to a second embodiment of the present disclosure.
Figure 4:
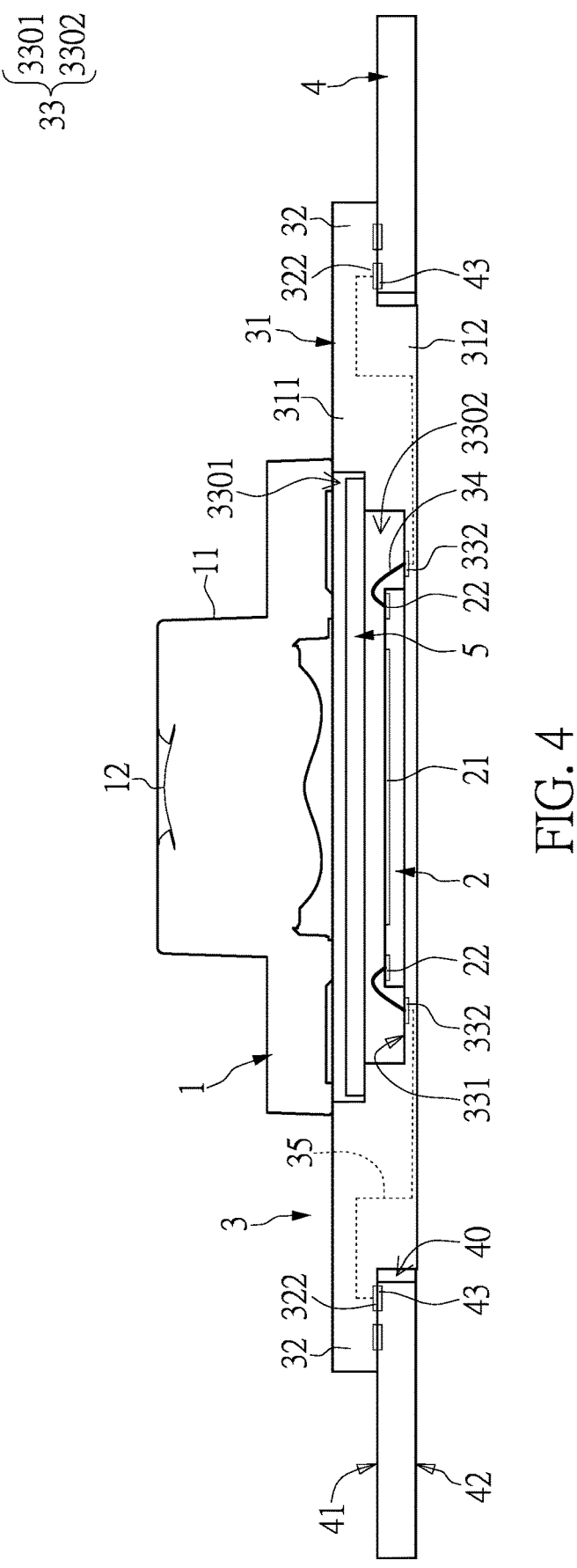
FIG. 4 is a schematic assembled view of the image-capturing module according to the second embodiment of the present disclosure.

Referring to FIG. 3 and FIG. 4, the second embodiment of the present disclosure provides a height-reduced image-capturing module (hereinafter referred to as the image-capturing module), and the image-capturing module includes a lens assembly 1, an image-sensing chip 2, a carrier base 3 and a circuit substrate 4. This embodiment is substantially the same as the first embodiment, the difference is that in this embodiment, the base groove 33 of the carrier base 3 is a stepped groove, which includes a first groove 3301 and a second groove 3302 formed under the first groove 3301 and communicated with the first groove 3301. The projection area of the first groove 3301 is greater than the projection area of the second groove 3302, and the projection area of the filter 5 is greater than the projection area of the second groove 3302 but less than the projection area of the first groove 3301, so that the filter 5 is accommodated in the first groove 3301 of the base groove 33, and the image-sensing chip 2 is accommodated in the second groove 3302 of the base groove 33. Therefore, in this example, the filter 5 with a larger light-transmitting area can be accommodated through the stepped base groove 33, and the distance between the filter 5 and the image-sensing chip 2 is relatively large, so that the dust on the filter 5 is less likely to be imaged on the photosensitive surface 21 of the image-sensing chip 2, thereby having less impact on the imaging quality.

Third Embodiment

Figure 5:
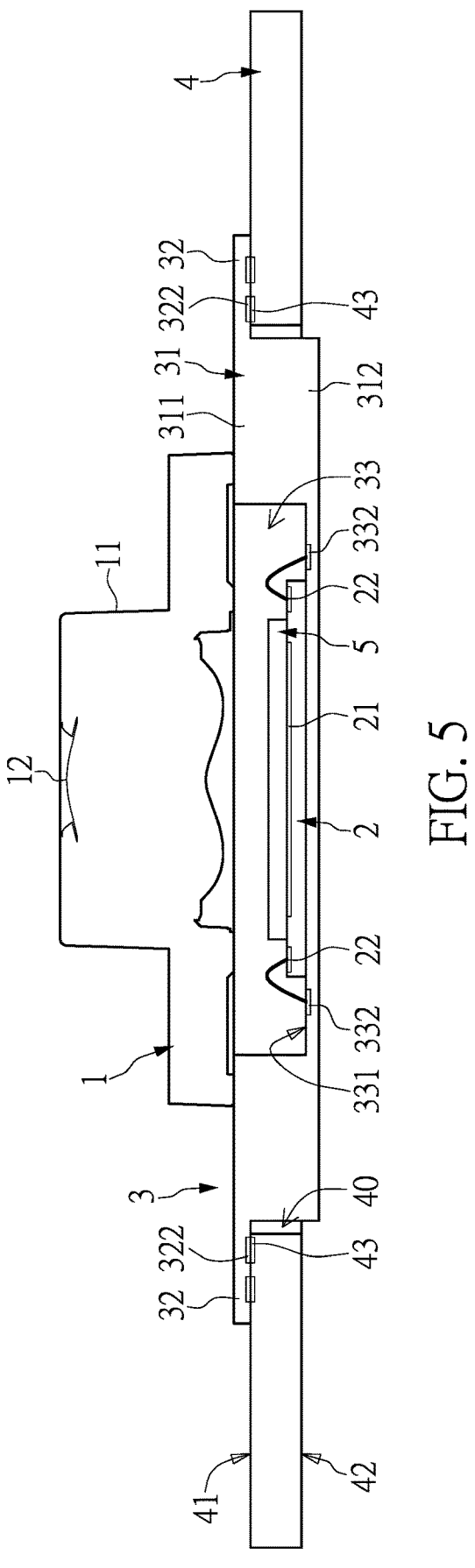
FIG. 5 is a schematic assembled view of the image-capturing module according to a third embodiment of the present disclosure.

Referring to FIG. 5, the third embodiment of the present disclosure provides a height-reduced image-capturing module (hereinafter referred to as the image-capturing module), and the image-capturing module includes a lens assembly 1, an image-sensing chip 2, a carrier base 3 and a circuit substrate 4. This embodiment is substantially the same as the first embodiment, the difference is that in this embodiment, the recessed bottom surface 331 of the base groove 33 is lower than the upper surface 41 of the circuit substrate 4, and the recessed bottom surface 331 of the base groove 33 is lower than the lower surface 42 of the circuit substrate 4, so that the height of the image-capturing module disposed on the upper surface 41 of the circuit substrate 4 can be further reduced under the condition that the TTL does not change.

Beneficial Effects of the Embodiments

In summary, in the height-reduced image-capturing module provided by the present disclosure, by virtue of "the circuit substrate 4 having a through opening 40," "the carrier base 3 having a base body 31, two extending plate bodies 32 extending laterally outward from an upper portion 311 of the base body 31, and a base groove 33 recessed downward from the upper portion 311 of the base body 31," "a lower portion 312 of the base body 31 being configured to enter the through opening 40 of the circuit substrate 4," "the two extending plate bodies 32 crossing over the through opening 40 of the circuit substrate 4 and are disposed on an upper surface 41 of the circuit substrate 4," "the image-sensing chip 2 being disposed on a recessed bottom surface 331 of the base groove 33, and the recessed bottom surface 331 of the base groove 33 and the upper surface 41 of the circuit substrate 4 being not at a same level, so that the recessed bottom surface 331 of the base groove 33 is lower than the upper surface 41 of the circuit substrate 4" and "the lens assembly 1 being disposed on the upper portion 311 of the base body 31 and corresponds to the image-sensing chip 2," the lower portion 312 of the base body 31 enters the through opening 40 of the circuit substrate 4 from the upper surface 41 of the circuit substrate 4, so that the recessed bottom surface 331 of the base groove 33 is lower than the upper surface 41 of the circuit substrate 4. In addition, the image-sensing chip 2 can be arranged on the recessed bottom surface 331 of the base groove 33 by the COB process, and the lens assembly 1 can be arranged on the upper portion 311 of the substrate body 31 and correspond to the image-sensing chip 2, so that the height of the image-capturing module can be reduced to a similar height of the module using the Flip-Chip process without changing the TTL.

However, the aforementioned details are disclosed for exemplary purposes only, and are not meant to limit the scope of the present disclosure.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A reduced-height image-capturing module, comprising:
a lens assembly;
an image-sensing chip;
a carrier base; and
a circuit substrate;
wherein the circuit substrate has a through opening;
wherein the carrier base has a base body, two extending plate bodies extending laterally outward from an upper portion of the base body, and a base groove recessed downward from the upper portion of the base body of the carrier base;
wherein a lower portion of the base body is configured to enter the through opening of the circuit substrate, and the two extending plate bodies cross over the through opening of the circuit substrate and are disposed on an upper surface of the circuit substrate;
wherein the image-sensing chip is disposed on a recessed bottom surface of the base groove of the base body of the carrier base, and the recessed bottom surface of the base groove and the upper surface of the circuit substrate are not at a same level, so that the recessed bottom surface of the base groove is lower than the upper surface of the circuit substrate;
wherein the lens assembly is disposed on the upper portion of the base body and corresponds to the image-sensing chip.

2. The reduced-height image-capturing module according to claim 1, wherein the lens assembly includes a lens holder disposed on the upper portion of the base body and a lens structure carried by the lens holder, and the lens structure corresponds to a photosensitive surface of the image-sensing chip.

3. The reduced-height image-capturing module according to claim 2, further comprising a filter disposed between the image-sensing chip and the lens structure.

4. The reduced-height image-capturing module according to claim 3, wherein the base groove of the carrier base is a stepped groove, and the base groove includes a first groove and a second groove formed under the first groove and communicated with the first groove; wherein a projection area of the first groove is greater than a projection area of the second groove, and a projection area of the filter is greater than the projection area of the second groove and less than the projection area of the first groove, so that the filter is accommodated in the first groove of the base groove, and the image-sensing chip is accommodated in the second groove of the base groove.

5. The reduced-height image-capturing module according to claim 1, wherein the image-sensing chip includes a plurality of chip metal pads disposed around a photosensitive surface thereof, and the carrier base includes a plurality of recessed metal pads disposed on the recessed bottom surface of the base groove, and the chip metal pads are electrically connected to the recessed metal pads by a plurality of metal leads, respectively.

6. The reduced-height image-capturing module according to claim 5, wherein the carrier base includes a plurality of lower metal pads disposed on a lower surface of each extending plate body thereof, and the circuit substrate includes a plurality of upper metal pads disposed on the upper surface thereof and around the through opening, and the lower metal pads are electrically connected to the upper metal pads through a plurality of conductive materials, respectively.

7. The reduced-height image-capturing module according to claim 6, wherein the recessed metal pads are electrically connected to the lower metal pads through a plurality of conductive lines of the carrier base, respectively.

8. The reduced-height image-capturing module according to claim 1, wherein the recessed bottom surface of the base groove is lower than a lower surface of the circuit substrate.

\* \* \* \* \*